US010454502B2

(12) United States Patent
Castelain (10) Patent No.: US 10,454,502 B2
(45) Date of Patent: *Oct. 22, 2019

(54) METHOD AND DEVICE AND COMPUTER PROGRAM FOR DEMODULATING RECEIVED SYMBOLS USING TURBO-DEMODULATION SCHEME

(71) Applicant: MITSUBISHI ELECTRIC CORPORATION, Tokyo (JP)

(72) Inventor: Damien Castelain, Rennes (FR)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 68 days.

This patent is subject to a terminal disclaimer.

(21) Appl. No.: 15/749,242

(22) PCT Filed: Aug. 31, 2016

(86) PCT No.: PCT/JP2016/076219
§ 371 (c)(1),
(2) Date: Jan. 31, 2018

(87) PCT Pub. No.: WO2017/056881
PCT Pub. Date: Apr. 6, 2017

(65) Prior Publication Data
US 2018/0226998 A1     Aug. 9, 2018

(30) Foreign Application Priority Data

Oct. 1, 2015  (EP) .................................... 15187974

(51) Int. Cl.
*H03M 13/37*     (2006.01)
*H03M 13/11*     (2006.01)
(Continued)

(52) U.S. Cl.
CPC .... *H03M 13/3746* (2013.01); *H03M 13/1111* (2013.01); *H03M 13/2957* (2013.01);
(Continued)

(58) Field of Classification Search
CPC .......... H03M 13/3746; H03M 13/1111; H03M 13/3723; H03M 13/2957; H03M 13/6525; H04L 1/005
See application file for complete search history.

(56) References Cited

U.S. PATENT DOCUMENTS 8,880,973 B1 * 11/2014 Li ....................... H03M 13/255
714/752
8,984,365 B1 *  3/2015 Norrie ................ H03M 13/1111
714/755

(Continued)

FOREIGN PATENT DOCUMENTS

| JP | 2010-508790 A | 3/2010 |
| JP | 2013-520941 A | 6/2013 |
| JP | 2014-204250 A | 10/2014 |

OTHER PUBLICATIONS

Simon Uzezi Ewedafe, Rio Hirowati Shariffudin "Parallel Implementation of 2-D Telegraphic Equation on MPI/PVM Cluster" International Journal of Parallel Programming 39.2: 202-231. New York: Springer Nature B.V. (Apr. 2011) (Year: 2011).*

(Continued)

*Primary Examiner* — Cynthia Britt
(74) *Attorney, Agent, or Firm* — Birch, Stewart, Kolasch & Birch, LLP (57) ABSTRACT

The present invention concerns a method and device for demodulating received symbols using a turbo-demodulation scheme comprising an iterative MIMO decoder and wherein an iterative channel decoder is used in the turbo-demodulation scheme, wherein the iterative channel decoder performs a first iterative process named iterative decoding (Continued)

process, the turbo-demodulation performing a second iterative process named iterative demodulation and decoding process, at each iteration of the second iterative process, the iterative channel decoder executing plural iterations in order to decode bits from which symbols are derived from. The iterative channel decoder:
- memorizes at the end of the iterations of the first iterative process, the variables used internally by the iterative channel decoder,
- reads the memorized variables at the following iteration of the second iterative process.

11 Claims, 5 Drawing Sheets

(51) Int. Cl.
　　　*H03M 13/29*　　　(2006.01)
　　　*H03M 13/00*　　　(2006.01)
　　　*H04L 1/00*　　　(2006.01)
(52) U.S. Cl.
　　　CPC ... *H03M 13/3723* (2013.01); *H03M 13/6525* (2013.01); *H04L 1/005* (2013.01)

(56) References Cited

U.S. PATENT DOCUMENTS

| | | | |
|---|---|---|---|
| 2007/0234184 A1* | 10/2007 | Richardson | H03M 13/1111 714/780 |
| 2011/0096858 A1* | 4/2011 | Klimer | H04B 7/0854 375/267 |
| 2012/0020402 A1 | 1/2012 | Ibing et al. | |
| 2012/0033752 A1* | 2/2012 | Yoshii | H03M 13/258 375/260 |
| 2015/0229437 A1* | 8/2015 | Djordjevic | H04L 27/3405 714/776 |
| 2016/0278161 A1* | 9/2016 | Eitan | H04W 76/10 |
| 2018/0234208 A1* | 8/2018 | Castelain | H03M 13/1111 |
| 2019/0052289 A1* | 2/2019 | Castelain | H03M 13/156 |

OTHER PUBLICATIONS

Kang et al., "Iterative Carrier Frequency Offset and Channel Estimation for Underwater Acoustic OFDM Systems", IEEE Journal on Selected Areas in Communications, IEEE Service Center, Piscataway, US, vol. 26, No. 9, Dec. 2008, pp. 1650-1661, XP011238894, ISSN: 0733-8716.

* cited by examiner

METHOD AND DEVICE AND COMPUTER PROGRAM FOR DEMODULATING RECEIVED SYMBOLS USING TURBO-DEMODULATION SCHEME

TECHNICAL FIELD

The invention concerns a method and a device for demodulating received symbols using a turbo-demodulation scheme.

BACKGROUND ART

The received symbols are transferred on plural streams and received through plural antennas, the turbo-demodulation scheme uses a turbo-demodulation scheme comprising an iterative MIMO (Multiple Input Multiple Output) decoder and wherein an iterative channel decoder is used in the turbo-demodulation scheme.

Implementing a turbo-demodulation scheme is complex, especially when an iterative channel decoder is used in the turbo-demodulation scheme.

When a powerful iterative channel decoder is used, for example using a LDPC code, a convolutional turbo-code (CTC) or a block turbo-code (BTC), the decoders of these codes have in common to work according to the turbo principle. Internally some units, either implemented in hardware or software, exchange information in an iterative way.

For a LDPC code, it is classically considered generally that at least 50 iterations are needed to get good performances. For turbo-codes, between 4 and 8 decoding iterations are needed.

When such a turbo-channel-decoder is implemented inside a turbo-demodulation scheme comprising at least a MIMO decoder, the complexity explodes. If 5 turbo iterations are used for the turbo-demodulation, with a LDPC decoder implementing 50 iterations inside, we get 250 LDPC iterations globally. The same reasoning can be used with turbo-codes.

SUMMARY OF INVENTION

Technical Problem

The present invention aims at significantly decreasing the total number of decoding iterations, without any performance degradation.

Solution to Problem

The present invention concerns a method for demodulating received symbols using a turbo-demodulation scheme, the received symbols being transferred on plural streams and received through plural antennas, the turbo-demodulation scheme comprising an iterative MIMO decoder decoding the plural streams and wherein an iterative channel decoder is used in the turbo-demodulation scheme, wherein the iterative channel decoder performs a first iterative process named iterative decoding process, the turbo-demodulation performing a second iterative process named iterative demodulation and decoding process, at each iteration of the second iterative process, the iterative channel decoder executing plural iterations in order to decode bits from which symbols are derived from, and wherein the method comprises the steps executed by the iterative channel decoder of:

memorizing at the end of the iterations of the first iterative process, the variables used internally by the iterative channel decoder, reading the memorized variables at the following iteration of the second iterative process.

The present invention concerns also a device for demodulating received symbols using a turbo-demodulation scheme, the received symbols being transferred on plural streams and received through plural antennas, the turbo-demodulation scheme comprising an iterative MIMO decoder decoding the plural streams and wherein an iterative channel decoder is used in the turbo-demodulation scheme, wherein, the iterative channel decoder performs a first iterative process named iterative decoding process, the turbo-demodulation performing a second iterative process named iterative demodulation and decoding process, at each iteration of the second iterative process, the iterative channel decoder executing plural iterations in order to decode bits from which symbols are derived from, and wherein the iterative channel decoder comprises:

a portion for memorizing at the end of the iterations of the first iterative process, the variables used internally by the iterative channel decoder, a portion for reading the memorized variables at the following iteration of the second iterative process.

Thus, during the second and following iterations of the second iterative process, it is possible to reduce the number of decoding iterations without any loss in performance and thus it is possible to reduce the complexity of the receiver for the same performance or to improve performance for the same complexity.

For example, if the iterative channel decoder uses a LDPC code, the present invention only needs 5 to 20 iterations in order to get good performances.

For example, if the iterative channel decoder uses Convolutional turbo-codes, the present invention only needs between 1 to 3 iterations in order to get good performances, instead of 4 to 8 without the present invention.

According to a particular feature, the received symbols are transferred by a source on a MIMO channel using Orthogonal Frequency Division Multiplex (OFDM).

Thus, the complexity is further decreased, this waveform allowing a frequency implementation of the demodulation/equalization, the demodulation/equalization being performed by parallel processing on an individual sub-carrier or on a small set of sub-carriers.

According to a particular feature, the received symbols are transferred by a source on a MIMO channel using a Single-Carrier Frequency Division Multiple Access (SC-FDMA).

Thus, complexity is further decreased, this waveform allowing a frequency implementation of the demodulation/equalization, the demodulation/equalization being performed by parallel processing on an individual sub-carrier or on a small set of sub-carriers.

According to a particular feature, the received symbols are transferred using a non-orthogonal transmission scheme Faster-Than-Nyquist.

Thus, performance and/or complexity is improved for this waveform, for which turbo-equalization improves performance when signal is transmitted when FtN is used.

According to a particular feature, the iterative MIMO decoder is a Minimum Mean Square Error (MMSE) equalization.

Thus, the complexity of the equalization module is reduced, which further reduces the overall complexity of the receiver.

According to a particular feature, the iterative MIMO decoder is a MMSE equalization per block, i.e. a block MMSE equalization, which allows an implementation in the frequency domain. Here, a block is an OFDM or a SC-FMDA symbol.

According to a particular feature, the turbo-demodulation scheme comprises an iterative channel estimation.

Thus, performance of channel estimation is improved, which improves the receiver performance.

According to a particular feature, the turbo-demodulation scheme comprises an iterative de-mapping.

Thus, performance is improved when the constellation is large enough ant when the bit-to-constellation mapping is well selected.

According to a particular feature, the iterative channel decoder receives from a controller messages indicating to the iterative channel decoder that iterative channel decoder has to read the memorized variables at the following iteration of the second iterative process or to reset the memorized variables.

Thus, the decoder uses the memory content when it is really needed only.

According to a particular feature, the turbo-demodulation scheme comprises a de-interleaving process based on a set of code blocks and in that the message further comprises the block identifier within the set of code blocks of the next block to be decoded.

Thus, the iterative channel decoder uses the memory content corresponding to the current code block.

According to a particular feature, the iterative channel decoder is a Low Density Parity Check decoder.

Thus, performance and/or complexity is improved, as LDPC decoder works in an iterative manner.

According to a particular feature, the iterative channel decoder is a Convolutional Turbo Code decoder.

Thus, performance and/or complexity is improved, as a Convolutional Turbo Code decoder works in an iterative manner.

According to a particular feature, the iterative channel decoder is a Block Turbo Code decoder.

Thus, performance and/or complexity is improved, as a Block Turbo Code decoder works in an iterative manner.

The present invention concerns also a computer program comprising program code instructions which can be loaded in a programmable device for implementing the method according to the first embodiment, when the program code instructions are run by the programmable device.

The present invention concerns also information storage means storing a computer program comprising program code instructions which can be loaded in a programmable device for implementing the method according to the first embodiment, when the program code instructions are run by the programmable device.

The characteristics of the present invention mentioned above, as well as other characteristics will appear more clearly on reading the following description of an example of an embodiment, said description being done in relation with the joint drawings.

DESCRIPTION OF EMBODIMENTS

Figure 1:
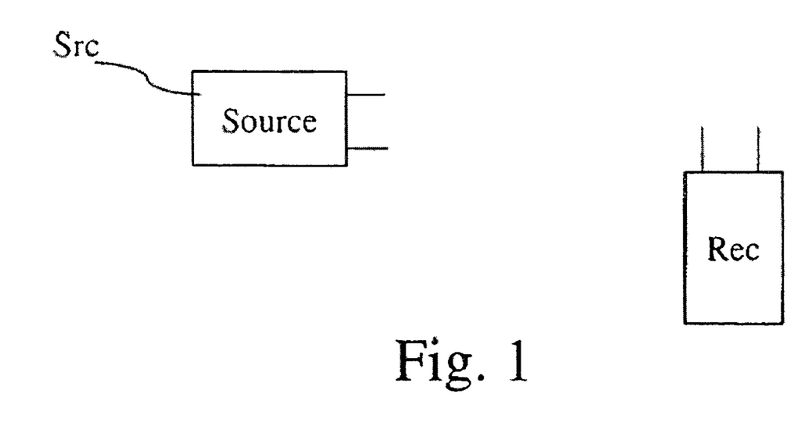
FIG. 1 illustrates schematically an example of a communication system in which the invention may be implemented.

FIG. 1 illustrates schematically an example of a telecommunication system in which the invention can be implemented.

The telecommunication system comprises at least a source Src which transmits symbols to at least one receiver Rec.

The telecommunication system uses MIMO schemes.

MIMO schemes are a way to increase the robustness and/or the spectral efficiency of a system.

The source Src comprises plural antennas and the receiver Rec comprises plural antennas.

The MIMO scheme may be distributed: in this case, the source Src is composed of several transmitters transmitting in parallel different data streams, each transmitter with one or several antennas.

The MIMO scheme is used to transmit at least two streams of symbols in parallel to the receiver Rec that the receiver Rec must decode.

Here the word 'stream' shall be understood according to 3GPP LTE terminology. Different data streams, after a possible linear processing, are transferred through several antennas. The antennas transmit different information.

The telecommunication system may be a 3GPP/LTE downlink wireless telecommunication system using for example Orthogonal Frequency Division Multiple (OFDM) or a broadcasting telecommunication network like a DVB (Digital Video Broadcast) second generation digital terrestrial television broadcasting system (DVB-T2) system using for example OFDM.

OFDM is a multicarrier system.

The telecommunication system may be a 3GPP/LTE uplink wireless telecommunication system using for example. Single-Carrier Frequency Division Multiple Access (SC-FDMA).

SC-FDMA is a modulation scheme with OFDM-type multiplexing but single-carrier-like envelope. It can be implemented either in the time-domain (IFDMA) or in the frequency-domain. In the last case, it is also called DFT-spread OFDM, or SC-FDE (Single Carrier Frequency domain Equalisation) or SC-OFDM (Single Carrier Frequency Division Multiple Access).

The present invention is applicable in any telecommunication system wherein an iterative MIMO decoding is needed and a channel decoder with an iterative decoding process is used.

According to a particular feature, the telecommunication system, for improving spectral efficiency, may use a non-orthogonal transmission scheme Faster-Than-Nyquist (FtN).

Inter-symbol interference (ISI) is a distortion that occurs to the sent symbols when they overlap partially or totally leading to a degraded detection performance at the receiver. ISI is a classical distortion that occurs in MIMO channel. Equalization is needed to cancel or limit performance degradation due to ISI and may be implemented, for example using a MMSE MIMO decoder in the frequency domain when a MIMO scheme is used. Turbo-MIMO decoder, i.e.

feedback from the channel decoder to the MIMO decoder, improves performance of the MIMO decoder, especially when the number of streams that the receiver Rec must decode is greater or equal to two.

Inter-symbol interference appears in a multipath channel and is generated in FtN. The FtN concept was introduced by Mazo in the paper entitled "Faster-than-Nyquist Signaling", published in Bell Syst. Tech. J, vol. 54, no. 8, pp. 1451-1462, October 1975.

FtN scheme may be used with a single carrier scheme like SC-FDMA.

The signal is modulated faster than the usual rate and introduces intentional ISI at the transmitter side.

In the Nyquist case, a signal is sent every T seconds while in the FTN case, the signal is sent every $\tau T$ seconds where $\tau<1$.

Mazo showed that sending pulses up to 25% faster than Nyquist rate doesn't decrease the minimum Euclidean distance between symbol sequences for a system using binary or QPSK modulation (Quadrature Phase Shift Keying).

FtN may be interpreted as a filtering at the source Src. Therefore it can be implemented in the time or frequency domain. The complexity of FtN lies in the receiver side which is responsible for compensating the intentional ISI introduced at the transmitter.

From the principle point of view, there is no difference between correcting ISI brought by a frequency selective multipath channel and correcting ISI introduced at the source Src and correcting ISI introduced by the MIMO scheme. The so-called MIMO decoder generally manages all types of ISI simultaneously in the same process.

Figure 2:
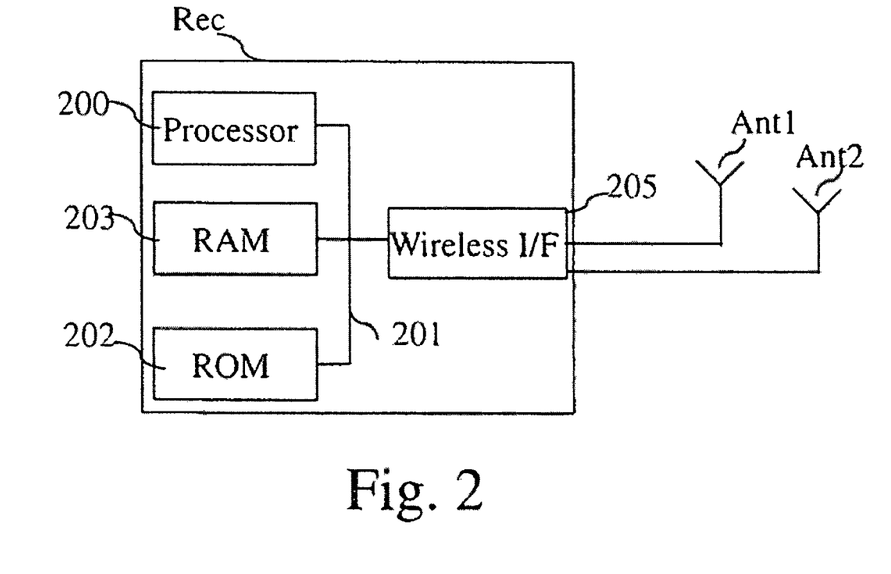
FIG. 2 illustrates schematically an example of a receiver in which the present invention may be implemented.

FIG. 2 illustrates schematically an example of a receiver in which the present invention may be implemented.

According to the shown architecture, the receiver Rec comprises the following components interconnected by a communication bus 201: a processor, microprocessor, microcontroller or CPU (Central Processing Unit) 200; a RAM (Random-Access Memory) 203; a ROM (Read-Only Memory) 202 and a wireless interface 205 connected to at least one antenna Ant.

The wireless interface 205 allows the receiver Rec to receive symbols through at least two antennas as shown in FIG. 2.

CPU 200 is capable of executing instructions loaded into RAM 203 from ROM 202 or from an external memory. After the receiver Rec is powered on, CPU 200 is capable of reading instructions from RAM 203 and executing these instructions. The instructions form one computer program that causes CPU 200 to decode received symbols according to the present invention.

The decoding may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

Figure 3:
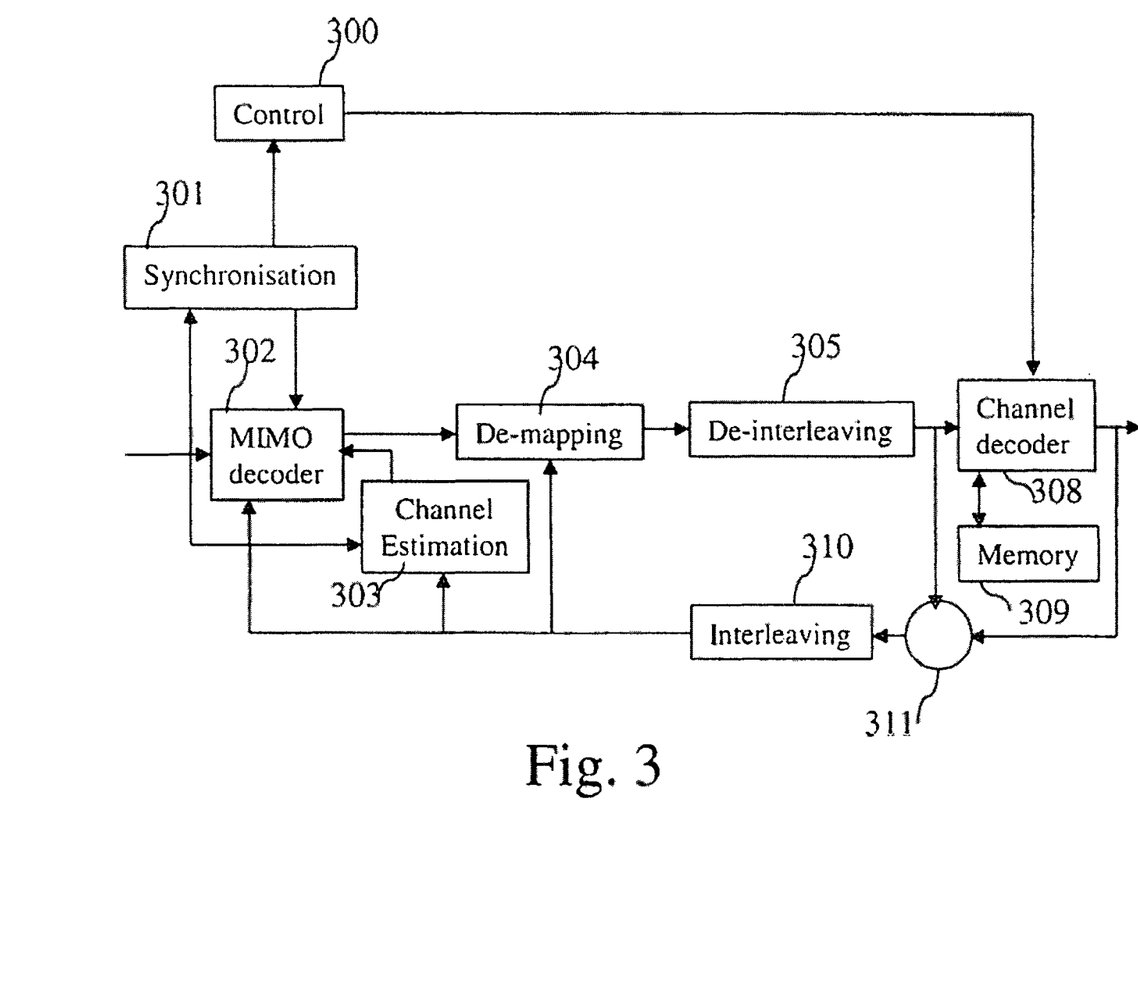
FIG. 3 represents an example of a hardware architecture of a wireless interface of the receiver in which the present invention may be implemented.

FIG. 3 represents an example of a hardware architecture of a wireless interface of the receiver in which the present invention may be implemented.

The example of hardware architecture given in FIG. 3 is in an MIMO context. The wireless interface 205 comprises a synchronization module 301, a control module 300, a MIMO decoder module 302, a channel estimation module 303, a de-mapping module 304, an iterative channel decoder 308 which is associated to a memory 309, a subtracting module 311 and may comprise a Fast Fourier Transform module not shown in FIG. 3, a de-interleaving module 305 and an interleaving module 310.

In the example of FIG. 3, the memory 309 is distinct from the iterative channel decoder 308. The memory 309 may be comprised in the iterative channel decoder 308.

The iterative channel decoder 308 is from a general point of view a turbo-decoder. A turbo decoder uses an iterative implementation of the decoding. The iterative channel decoder 308 performs a first iterative process named iterative decoding process.

The channel estimation module 303, the iterative MIMO decoder 302, the de-mapping module 304, the iterative channel decoder 308, the subtracting module 311 and the de-interleaving module 305 and the interleaving module 310 if there is form a second iterative process named iterative demodulation and decoding process. At each iteration of the second iterative process, the iterative channel decoder 308 executes plural iterations in order to decode bits.

The channel estimation module 303, the iterative MIMO decoder 302, the de-mapping module 304, the subtracting module 311 and if there the de-interleaving module 305 and the interleaving module 310 perform a demodulation process in the example of the present invention.

At the end of the first iterative process, the iterative channel decoder 308 provides extrinsic information used by the second iterative process in order to perform a block equalization and according to particular features used by a channel estimation and/or a de-mapping at the following step of the second iterative process.

Extrinsic information is for example a Log Likelihood Ratio (LLR) about the transmitted bits of the transmitted symbols.

The wireless interface 205 comprises then at least two interlinked iterative processes in order to decode receive symbols.

According to the invention, the iterative channel decoder 308 memorizes in a memory 309, at the end of the iterations of the first iterative process, the variables used by the iterative channel decoder 308 and reads the stored variables at the following iteration of the second iterative process.

The wireless interface 205 comprises synchronization module 301 which provides synchronization information related to start of frames, start of blocks to a control module 300, to the channel estimation module 303 and to the de-mapping module 304, and more generally such synchronization information to all modules which may need them. Here a frame corresponds to one or several codewords. When an interleaving is applied, we assume for simplicity of the description that a frame corresponds to one interleaving depth.

The control module 300, from the information received from the synchronization module 301, generates according to the present invention a command signal indicating to the iterative channel decoder 308 if the iterative channel decoder 308 has to read in the memory 309 information previously stored in the memory 308, i.e. reuse the stored variables at a previous iteration or if the iterative channel decoder 308 has to re initialize the stored variables in the memory 308.

The channel estimation module 303 may perform a first channel estimation by performing a preliminary and non perfect channel estimation, on some pilots or on data in a blind way and may perform in the following iterations a channel estimation on pilots or data using in addition extrinsic information provided by the interleaving module 310 if there or using in addition extrinsic information provided by the subtracting module 311.

The output of the channel estimation module 303 is provided to the MIMO decoder 302 which performs a decoding based on channel estimates and received symbols at first iteration and, from the second iteration, based on channel estimates, received symbols and the extrinsic information provided by the interleaving module 310 if there or provided by the subtracting module 311. The results of the MIMO decoder 302 consist in estimates of the transmitted symbols. These estimates generally consist in soft values.

The MIMO decoder 302 provides its results to the de-mapping module 304 and optionally to the channel estimation module 303 for a further improvement of the channel estimation. The de-mapping module 304 may perform a turbo de-mapping based on the output of the MIMO decoder 302 at first iteration and based on the output of the MIMO decoder 302 and the extrinsic information provided by the interleaving module 310 if there or provided by the subtracting module 311 from the second iteration of the second iterative process.

The output of the de-mapping module 304 consists in soft estimations like LLR and is provided to a de-interleaving module 305 if there which de-interleaves the soft estimations or is provided to the channel decoder 308.

The de-interleaving module 305 may de-interleave the soft estimations code block by code block or may de-interleave the soft estimations by set of code blocks if interleaving is performed on a set of code blocks.

A block corresponds to a codeword.

The output of the de-interleaving module 305 is provided to the iterative channel decoder 308.

The iterative channel decoder 308 is for example a LDPC (Low Density Parity Check) decoder or a CTC (Convolutional Turbo Code) decoder or a BTC (Block Turbo Code) decoder.

LDPC codes are linear block codes, the syndrome matrix H of which being sparse. The sparse aspect means that parity equations only contain a relatively low number of variables, generally between 2 and 80, orders of magnitude lower than the size of the code block.

LDPC codes exhibit a performance extremely close to the best possible as determined by the Shannon capacity formula.

LDPC codes are well represented by bipartite graphs in which one set of nodes, the variable nodes, corresponds to elements of the codeword and the other set of nodes, the check nodes, corresponds to the set of parity-check constraints which define the code.

Variable nodes and check nodes exchange messages iteratively. A check node gets messages from its neighbour nodes, processes the messages, and sends the resulting messages back to its neighbour nodes. Neighbour nodes are the variable nodes which are involved in the corresponding check. Similarly, a variable node receives messages from its neighbour nodes, processes the messages, and sends messages back to its neighbour nodes. Here, neighbour nodes are the check nodes where the variable is involved. Each output message of a variable or a check node is a function of all incoming messages to the node except the incoming message from the neighbour node that the output message is sent to.

This two-step procedure is repeated many times. After n such iterations, each variable node decodes its associated bit based on all information obtained from neighbours and from the iterative decoder block input.

Classically, log-likelihood ratios (LLRs) are used as messages, i.e., we use $$L(v) = \log \frac{p(y \mid x = 0)}{p(y \mid x = 1)}$$

as the soft representative of the bit x associated to the variable v.

At the $i^{th}$ LDPC iteration:

$$L^i(v \rightarrow c) = \log \frac{p(y_c^{i-1} \mid x = 0)}{p(y_c^{i-1} \mid x = 1)}$$

is the output message of a variable node v to a check node c, where x is the bit associated to the variable node and $y_c^{i-1}$ denotes all the information available to the node up to the present iteration obtained from edges other than the one corresponding to check node c. Therefore, the information sent from check node c to v at previous iteration (i−1) is omitted, in order to avoid always positive counter reaction.

At the first iteration, for starting of the decoding process, these values are equal to the a priori information available, i.e. the inputs $L_a(v)$ $$L^1(v \rightarrow c) = L_a(v) \forall v, c$$

Likewise, we define the output message of a check node as $$L^i(c \rightarrow v) = \log \frac{p(y_v^i \mid x = 0)}{p(y_v^i \mid x = 1)}$$

Where i is the iteration index, x is the bit associated to the variable node v that gets the message from the check node c, and $y_v^i$ denotes all the information available to the check node c up to the present iteration obtained from edges other than the one corresponding to v.

Under sum-product decoding, the message from a variable node to a check node is equal to the sum of all incoming LLRs, including a priori information, but excluding the previous message coming from this check node:

$$L^i(v \rightarrow c) = L_a(v) + \sum_{c'(c' \neq c)} L^{i-1}(c' \rightarrow v) = L_a(v) + L_{ext}^i(v) - L^{i-1}(c \rightarrow v)$$

Where the extrinsic information associated to a variable v is defined as:

$$L_{ext}^i(v) = \sum_c L^{i-1}(c \rightarrow v)$$

The message update rule for a check node c associated with $d_c$ variables $v_j$ can be obtained for example from the following equation:

$$L^i(c \rightarrow v) = L^i(v_1 \rightarrow c) \boxplus L^i(v_2 \rightarrow c) \boxplus \ldots \boxplus L^i(v_{d_c} \rightarrow c)$$
excluding $v_j = v$ With the definition of the operation $\boxplus$:

$$\tanh\left(\frac{x \boxplus y}{2}\right) = \tanh\left(\frac{x}{2}\right)\tanh\left(\frac{y}{2}\right).$$

The operation ⊞ is commutative and associative, which allows a recursive implementation. For example, this operation can be implemented by:

$$x \boxplus y' = \text{sgn}(x)\text{sgn}(y)\min(|x|,|y|) + f(x+y) - f(x-y).$$

The function $f$ is given by $f(u) = \log(1 + e^{-|u|})$

It has to be noted here that a simplified version of the equation $L^i(c \rightarrow v)$ may be used.

According to the invention, each information $L_{ext}$ (c→v) is stored in memory 309 at last iteration of the first iterative process and each information $L_{ext}$ (c→v) is read at next iteration of the second iterative process for the same code block. Once the information is read, node c sends to each connected variable node v: $L_{ext}$ (c→v).

The iterative channel decoder 308 is for example a CTC decoder. A CTC code consists in parallel concatenation of convolutional codes. Generally, two convolutional codes are used.

So-called turbo codes are known from a publication disclosed in Proc. 1993 IEEE International Conference of Communications, Geneva, Switzerland, pp 1064-1070 of May 1993 under the title "Near Shannon Limit Error-Correcting coding and decoding: Turbo-Codes", the authors of which are Berrou C., Glavieux A. and Thitimajshima P.

These codes designate a set of error-correcting codes constituted by the concatenation in parallel of a number of Recursive Systematic Convolutional (RSC) codes, each elementary code being separated from the preceding one by means of an interleaving process.

The sequences coded in this way are decoded by an iterative method with weighted inputs and outputs commonly referred to as turbo decoding. Each turbo decoding iteration is composed of the association in series or parallel of elementary decoders each corresponding to an elementary code. The weighted information produced by each elementary decoder (referred to as extrinsic information) is de-interleaved and then propagated to the input of another elementary decoder. Therefore messages are exchanged between elementary convolutional decoders.

The fact that each elementary decoder generates its extrinsic information from only part of the available information (i.e. the bits related to the corresponding elementary encoder) justifies the iterative process: the extrinsic information is sent to another elementary decoder (in serial implementation), the second decoder within one iteration or the first one from one iteration to the next one) which updates its input information by adding the extrinsic information of the previous decoder. One decoding iteration is made of the concatenation (or parallel processing in a parallel implementation) of the elementary decoders (2 in the case of two dimensional turbo codes). From one decoding to the next one, the amplitude of the extrinsic information increases, i.e. the estimation of the decoded bits becomes more and more reliable. Equivalently, a performance gain is achieved from one iteration to the next one. After several iterations, the amplitude of the extrinsic information does not change: all available information is "exhausted" and the algorithm has converged.

For example, by assuming two (n) elementary codes and that the decoding is performed serially, the extrinsic information coming from the second ($n^{th}$) decoder is stored in memory at last iteration of the first iterative process and each extrinsic information is read at next iteration of the second iterative process for the same block. In case the decoding is performed in parallel on the two (n) decoders, the extrinsic information coming from both or all decoders is stored in memory at last iteration of the first iterative process and each variable extrinsic information is read at next iteration of the second iterative process for the same block.

The iterative channel decoder 308 is for example a block turbo decoder (BTC).

BTC codes consist in serial concatenation of short block-codes and need an iterative decoding.

Generally, data are represented in a matrix. Each line is encoded by an elementary linear block code and then each column is encoded by the same or another elementary linear block code.

In the iterative decoder, messages are exchanges between decoders on horizontal dimension and decoders on vertical dimension.

This implies that soft input soft output decoders are used for the elementary short codes.

By assuming that decoding is performed first on horizontal dimension, the extrinsic information coming from decoders on vertical dimension is stored in memory at last iteration of the first iterative process and each extrinsic information coming from decoders on vertical dimension is read for decoding on horizontal dimension at next iteration of the second iterative process for the same block.

The output of the iterative channel decoder 308 is outputted as the decoded symbols and provided to the processor 200, to the subtracting module 311 which subtracts the output of the de-interleaving module 305 if there to the output of the iterative channel decoder 308 or subtracts the output of the de-mapping module 304 to the output of the iterative channel decoder 308.

The output of the subtracting module 311 so-called extrinsic information is provided to the interleaving module 310 if there which performs a reverse process as the one performed by the de-interleaving module 305 or to the de-mapping module 304, to the MIMO decoder 302 and to the channel estimation module 303.

If there, the output of the interleaving module 310 is provided to the de-mapping module 304, to the MIMO decoder 302 and to the channel estimation module 303.

Figure 4:
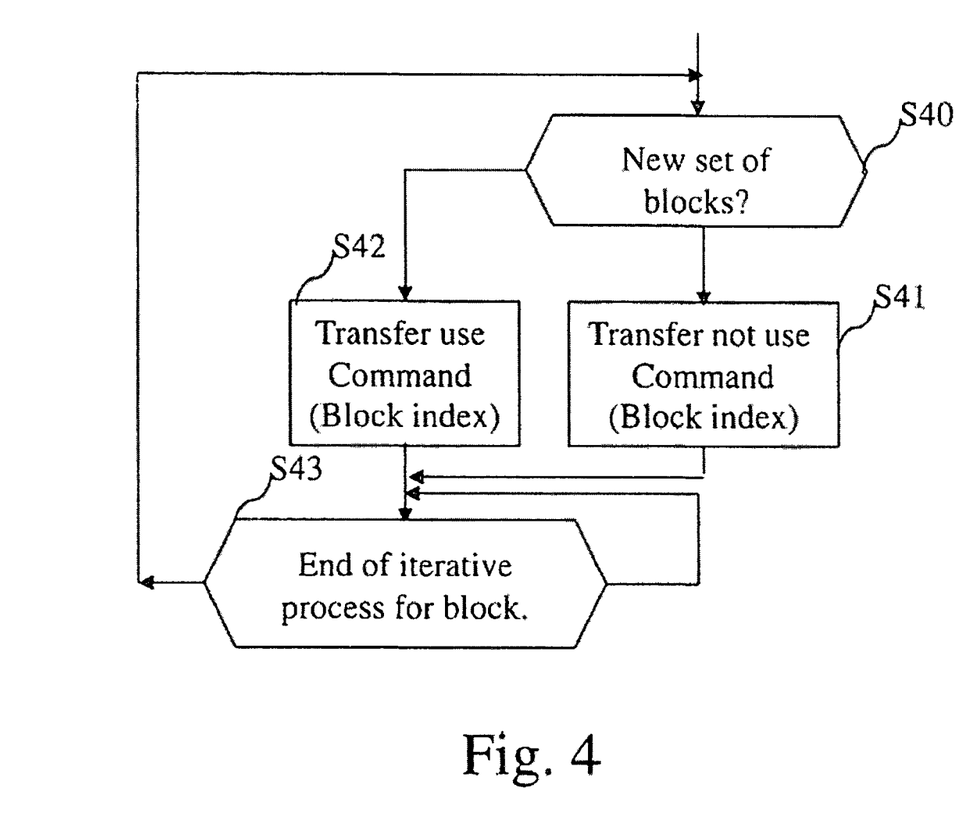
FIG. 4 represents an example of an algorithm executed by the control module according to the present invention.

FIG. 4 represents an example of an algorithm executed by the control module according to the present invention.

At step S40, for example at the beginning of a new MIMO decoding iteration, the control module 300 checks if a new code block or a new set of code blocks is received i.e. if a new frame is received. The control module 300 receives, from the synchronization module 301, information related to start of frames and start of code blocks. The control 300 is informed of state of each module of the wireless interface disclosed in reference to FIG. 3.

If a new block or a new set of blocks is received, the control module 300 moves to step S41. Otherwise, the control module 300 moves to step S42.

At step S42, the control module 300 transfers to the iterative channel decoder 308 a command signal indicating to the iterative channel decoder 308 that the iterative channel decoder 308 has to read in the memory 309 information previously stored in the memory 309, i.e. reuse the stored variables at a previous iteration.

If an interleaving is performed on a set of blocks and not on a unique block, the control module 300 transfers also a block index to be used by the channel decoder 308 for retrieving the stored variables at a previous iteration for the block the index is transferred.

After that, the control module 300 moves to step S43.

At step S41, the control module 300 transfers to the iterative channel decoder 308 a command signal indicating to the iterative channel decoder 308 that the iterative channel decoder 308 has to reinitialize the variables stored in the memory 308. If an interleaving is performed on a set of blocks and not a unique one, the control module 300 transfers also a block index to be used by the channel decoder 308 for determining in which part of memory 309 the extrinsic information must be stored at the end of the decoding process.

After that, the control module 300 moves to step S43.

At next step S43, the control module 300 checks if the iterative decoding by the channel decoder 308 for the currently processed code block ends.

If the iterative decoding by the channel decoder 308 ends, the processor 300 moves to step S40. Otherwise, the processor 300 returns to step S43.

Figure 5:
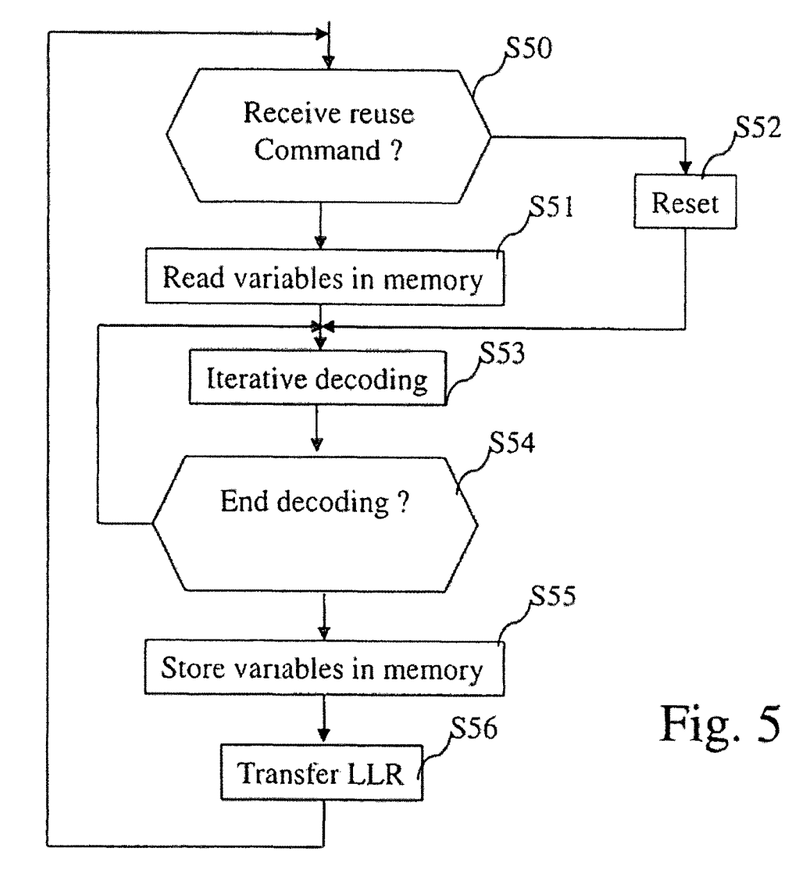
FIG. 5 represents an example of an algorithm executed by the iterative channel decoder according to the present invention.

FIG. 5 represents an example of an algorithm executed by the iterative channel decoder according to the present invention.

At step S50, after having received from the control module 308 a message indicating that a new code block is available and that a decoding must begin the iterative channel decoder 308 checks if a command signal is received. This command signal is a 'reuse' or 'not reuse' command. The 'reuse' command signal indicates to the iterative channel decoder 308 that the iterative channel decoder 308 has to read in the memory 309 information previously stored in the memory 309, i.e. reuse the stored variables at a previous iteration.

If an interleaving is performed on a set of code blocks, the command signal further comprises also a block index to be used by the channel decoder 308. If a 'reuse' command is received, it will be used for retrieving the stored variables at a previous iteration for the block the index is transferred.

If a command signal indicating to the iterative channel decoder 308 that the iterative channel decoder 308 has to read in the memory 309 information previously stored in the memory 309, the iterative channel decoder 308 moves to step S51. Otherwise, the iterative channel decoder 308 moves to step S52.

At step S51, the iterative channel decoder 308 reads in the memory 309, each extrinsic information stored in memory 309 at last iteration of the first iterative process. If an interleaving is performed on a set of blocks, the iterative channel decoder 308 reads in the memory 309, each extrinsic information stored in memory 309 at last iteration of the first iterative process which corresponds to the block the index of which is comprised in the control message.

If the iterative channel decoder 308 is a LDPC, the iterative channel decoder 308 reads in the memory 309 each variable $L_{ext}$ (c→v) stored in memory 309 at last iteration of the first iterative process and each variable $L_{ext}$ (c→v)

If the iterative channel decoder 308 is a LDPC and if the interleaving is performed on a set of blocks, the iterative channel decoder 308 reads in the memory 309, each variable $L_{ext}$ (c→v) stored in memory 309 at last iteration of the first iterative process and each variable $L_{ext}$ (c→v) which correspond to the block the index of which is comprised in the control message.

After that, the iterative channel decoder 308 moves to step S53.

At step S52, the iterative channel decoder 308 resets the extrinsic information stored in memory 309 at last iteration of the first iterative process, corresponding to the received code block index if an interleaving is performed on a set of blocks.

Once the extrinsic information is read or reset, the iterative channel decoder uses this information for decoding.

If the iterative channel decoder 308 is a LDPC, once the information is read, node c sends to each variable node v: $L_{ext}$ (c→v) for the beginning of the decoding process of the currently decoded block.

After that, the iterative channel decoder 308 moves to step S53.

At step S53, the iterative channel decoder 308 starts a new iterative decoding. By reading in the memory 309 information previously stored in the memory 309 at previous iteration of the second iterative process for the same block, the present invention reduces drastically the number of iterations of the second iterative process and therefore reduces the complexity of the receiver.

At next step S54, the iterative channel decoder 308 checks if the last iteration of the first iterative process is executed.

If the last iteration of the first iterative process is executed, the iterative channel decoder 308 moves to step S55. Otherwise, the iterative channel decoder 308 returns to step S53.

At step S55, the iterative channel decoder 308 stores the internal extrinsic information in the memory 309.

If an interleaving is performed on a set of blocks, the iterative channel decoder 308 stores the internal extrinsic information in the memory 309 in a memory area dedicated to the block using the index received at step S50.

At next step S56, the iterative channel decoder 308 transfers the soft decoded information to the subtracting module 311 and to the processor 200. The soft decoded information is for example a Log Likelihood Ratio (LLR) about the transmitted bits of the transmitted symbols.

INDUSTRIAL APPLICABILITY

The method and system for demodulating received symbols using a turbo-demodulation scheme of this invention are applicable to systems in many kinds of fields.

The invention claimed is:
1. A method for demodulating received symbols using a turbo-demodulation scheme, the received symbols being transferred on plural streams and received through plural antennas, the turbo-demodulation scheme comprising an iterative MIMO decoder decoding the plural streams, a de-interleaving process based on a set of several code blocks of a channel code and wherein an iterative channel decoder is used in the turbo-demodulation scheme for iteratively decoding a channel code, wherein the iterative channel decoder performs a first iterative process named iterative decoding process, the turbo-demodulation performing a second iterative process named iterative demodulation and decoding process, at each iteration of the second iterative process, the iterative channel decoder executing plural iterations in order to decode bits from which symbols are derived, the turbo-demodulation scheme comprises a de-interleaving process based on a set of several code blocks of said channel code, and wherein the method comprises the steps executed by the iterative channel decoder of:
   memorizing at the end of the iterations of the first iterative process, the variables used internally by the iterative channel decoder,
   receiving, by the iterative channel decoder, a controller message indicating to the iterative channel decoder that the iterative channel decoder has to read the memorized variables at the following iteration of the second iterative process or to reset the memorized variables, the message further comprising the block identifier within the set of several code blocks of the next block to be decoded, reading the memorized variables corresponding to the block identifier within the set of several code blocks of the next block to be decoded at the following iteration of the second iterative process when a message indicating to the iterative channel decoder that iterative channel decoder has to read the memorized variables.

2. The method according to claim 1, wherein the received symbols are transferred by a source using orthogonal frequency division multiple access.

3. The method according to claim 1, wherein the received symbols are transferred by a source using a single-carrier orthogonal frequency division multiplex.

4. The method according to claim 3, wherein the received symbols are transferred using a non-orthogonal transmission scheme Faster-Than-Nyquist.

5. The method according to claim 1, wherein the iterative MIMO decoder is a Minimum Mean Square Error equalization.

6. The method according to claim 1, wherein the turbo-demodulation scheme comprises an iterative channel estimation.

7. The method according to claim 1, wherein the turbo-demodulation scheme comprises an iterative de-mapping.

8. The method according to claim 1, wherein the iterative channel decoder is a Low Density Parity Check decoder.

9. The method according to claim 1, wherein the iterative channel decoder is a Convolutional Turbo Code decoder.

10. The method according to claim 1, wherein the iterative channel decoder is a Block Turbo Code decoder.

11. A device for demodulating received symbols using a turbo-demodulation scheme, the received symbols being transferred on plural streams and received through plural antennas, the turbo-demodulation scheme comprising an iterative MIMO decoder decoding the plural streams, a de-interleaving process based on a set of several code blocks of a channel code and wherein an iterative channel decoder is used in the turbo-demodulation scheme for iteratively decoding a channel code, wherein, the iterative channel decoder performs a first iterative process named iterative decoding process, the turbo-demodulation performing a second iterative process named iterative demodulation and decoding process, at each iteration of the second iterative process, the iterative channel decoder executing plural iterations in order to decode bits from which symbols are derived, the turbo-demodulation scheme comprises a de-interleaving process based on a set of several code blocks of said channel code, and wherein the iterative channel decoder comprises:

a portion for memorizing at the end of the iterations of the first iterative process, the variables used internally by the iterative channel decoder, a portion for receiving, by the iterative channel decoder, a controller message indicating to the iterative channel decoder that the iterative channel decoder has to read the memorized variables at the following iteration of the second iterative process or to reset the memorized variables, the message further comprising the block identifier within the set of several code blocks of the next block to be decoded, a portion for reading the memorized variables corresponding to the block identifier within the set of several code blocks of the next block to be decoded at the following iteration of the second iterative process when a message indicating to the iterative channel decoder that iterative channel decoder has to read the memorized variables.

* * * * *